United States Patent
Kang et al.

(10) Patent No.: US 9,509,309 B2
(45) Date of Patent: Nov. 29, 2016

(54) SEMICONDUCTOR DEVICE

(71) Applicant: Samsung Electronics Co., Ltd., Suwon-si, Gyeonggi-do (KR)

(72) Inventors: SukYong Kang, Suwon-si (KR); Han-Gi Jung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/972,453

(22) Filed: Dec. 17, 2015

(65) Prior Publication Data

US 2016/0197612 A1 Jul. 7, 2016

(30) Foreign Application Priority Data

Jan. 7, 2015 (KR) ........................ 10-2015-0001814

(51) Int. Cl.
*H03K 17/16* (2006.01)
*H03K 19/003* (2006.01)
*H03K 19/0175* (2006.01)

(52) U.S. Cl.
CPC ............................ *H03K 19/017545* (2013.01)

(58) Field of Classification Search
CPC ................ H03K 19/0005; H03K 19/017545; H03K 3/012; G05F 1/652
USPC ....................................... 326/30, 82, 83, 87
See application file for complete search history.

(56) References Cited

U.S. PATENT DOCUMENTS

| | | | |
|---|---|---|---|
| 6,414,512 B1 | 7/2002 | Moyer | |
| 6,980,020 B2 | 12/2005 | Best et al. | |
| 7,034,567 B2 | 4/2006 | Jang | |
| 7,282,955 B2 | 10/2007 | Kim | |
| 7,365,564 B2 | 4/2008 | Kim | |
| 8,040,164 B2 | 10/2011 | Parameswaran et al. | |
| 8,278,968 B2 | 10/2012 | Nguyen et al. | |
| 8,487,650 B2 | 7/2013 | Fazeel et al. | |
| 8,749,266 B2 | 6/2014 | Lee | |
| 2002/0050838 A1* | 5/2002 | Kim | H03K 19/0005 326/30 |
| 2008/0048714 A1* | 2/2008 | Lee | H03K 19/0005 326/30 |
| 2013/0021056 A1 | 1/2013 | Nguyen et al. | |
| 2015/0280709 A1* | 10/2015 | Cho | H03K 19/0005 326/30 |

FOREIGN PATENT DOCUMENTS

KR    0980423 B1    9/2010

* cited by examiner

*Primary Examiner* — Daniel D Chang
(74) *Attorney, Agent, or Firm* — Harness, Dickey & Pierce, P.L.C.

(57) ABSTRACT

A semiconductor device may include a termination resistor circuit including a first termination resistor connected to a power voltage and a second termination resistor between the first termination resistor and a ground, a value of the first termination resistor and the second termination resistor changes based on a feedback signal; a mismatch detector may generate a compared result based on a potential difference between a voltage of a center node, between the first and second termination resistors, and a reference voltage; a code generator may generate the feedback signal based on the compared result, and generate a feedback code based on the compared result; a code register may generate a mismatch code controlling a mismatch between the first and second termination resistors based on the feedback code; and a corrector may compensate for the mismatch between the first and second termination resistors based on the mismatch code.

20 Claims, 14 Drawing Sheets

1200

1400

SEMICONDUCTOR DEVICE

CROSS-REFERENCE TO RELATED APPLICATION

This application claims priority from Korean Patent Application No. 10-2015-0001814 filed on Jan. 7, 2015 in the Korean Intellectual Property Office, the disclosure of which is incorporated herein by reference in its entirety.

BACKGROUND

1. Field of the Inventive concept

Example embodiments of the inventive concepts relate to a semiconductor device.

2. Description of the Related Art

A memory system may include a memory device and a memory controller, the memory device and the memory controller being connected to each other by a transmission line transferring a signal. In general, the transmission line is terminated with a set voltage level for a stable signal transfer. Termination schemes may include a Center Tap Termination (CTT) scheme and a High Tap Termination (HTT) scheme.

In the CTT scheme, a scheme of terminating a transmission line with half of a power voltage, a termination resistor may be connected between a power voltage source and a center node in parallel therewith and another termination resistor may be connected between the center node and a ground in parallel therewith. However, due to a mismatch in a process, a resistance value of the termination resistor between the power voltage source and the center node and a resistance value of the termination resistor between the center node and the ground may be varied.

An eye pattern may be used to evaluate a data transmission using an oscilloscope to display received data bits in synchronization with a clock signal. In the data transmission, rectangular edges between "1" and "0" states may appear rounded due to unwanted jitter and phase distortion, thus forming an eye pattern. Therefore, when the aperture of the eye pattern is wider, the data transmission may have a better signal quality. However, due to the mismatch between the resistance values, the eye aperture of a corresponding semiconductor device may not have symmetrical characteristics. When a plurality of semiconductor devices are simultaneously used, characteristics in which eye apertures of the respective devices are overlapped with each other, that is, eye aperture characteristics of the entire semiconductor device, may be deteriorated.

Thus, demand for solutions capable of improving the eye aperture characteristics has been increasing.

SUMMARY

Example embodiments of the inventive concepts may provide a semiconductor device in which eye aperture characteristics may be improved by compensating for a mismatch in termination resistance.

Additional advantages, subjects, and features of the example embodiments of the inventive concepts will be set forth in part in the description which follows and in part will become apparent to those having ordinary skill in the art upon examination of the following or may be learned from practice of the example embodiments of the inventive concepts.

In some example embodiments of the inventive concepts, there is provided a semiconductor device comprising a termination resistor circuit including a first termination resistor connected to a power voltage and a second termination resistor between the first termination resistor and a ground, a value of the first termination resistor and the second termination resistor changes based on a feedback signal; a mismatch detector configured to generate a compared result based on a potential difference between a voltage of a center node and a reference voltage, the center node being between the first termination resistor and the second termination resistor, and a value of the reference voltage being half of the power voltage; a code generator configured to generate the feedback signal based on the compared result, and generate a feedback code based on the compared result; a code register configured to generate a mismatch code controlling a mismatch between the first termination resistor and the second termination resistor based on the feedback code; and a corrector configured to compensate for the mismatch between the first termination resistor and the second termination resistor based on the mismatch code, wherein the termination resistor circuit is configured to set the values of the first termination resistor and the second termination resistor to an initial value based on the feedback signal when the compared result of the mismatch detector changes from a first state to a second state, the second state being different from the first state.

In some example embodiments of the inventive concepts, there is provided a semiconductor device comprising a termination resistor circuit including a first termination resistor connected to a power voltage and a second termination resistor between the first termination resistor and a ground, a value of the first termination resistor and the second termination resistor changes based on a feedback signal; a mismatch detector configured to generate a compared result based on a potential difference between a voltage of a center node and a reference voltage, the center node being between the first termination resistor and the second termination resistor, and a value of the reference voltage being half of the power voltage; a code generator configured to generate the feedback signal based on the compared result and generate a feedback code based on the compared result; a code register configured to generate a mismatch code, the mismatch code controlling a mismatch between the first termination resistor and the second termination resistor based on the feedback code; a corrector configured to compensate for the mismatch between the first termination resistor and the second termination resistor based on the mismatch code; a controller configured to set an initial value of the first termination resistor and the second termination resistor, and the controller configured provide the initial value of the first termination resistor and the second termination resistor to the code generator; a buffer configured to connect to the termination resistor circuit; and a repeater configured to connect to the buffer, wherein the termination resistor circuit set the values of the first termination resistor and the second termination resistor to the initial value based on feedback signal when the compared result changes from a first state to a second state, the second state being different from the first state, and the corrector configured to control at least one of the termination resistor circuit, the buffer, and the repeater and configured to compensate for the mismatch between the first and second termination resistors based on the mismatch code.

In some example embodiments of the inventive concepts, there is provided a semiconductor device comprising a first termination resistor circuit including a first termination resistor connected to a power voltage and a second termination resistor disposed between the first termination resistor and a ground; a second termination resistor circuit provided as a replica of the first termination resistor circuit and including third termination resistor and the fourth termination resistor, replicas of the respective first termination resistor and the second termination resistor; a mismatch detector configured to compare a potential difference between a voltage of a center node and a reference voltage, the center node being between the third termination resistor and the fourth termination resistor, a value of the reference voltage being half of the power voltage; a code generator configured to generate a feedback signal changing values of the third and fourth termination resistors by receiving a compared result and configured to generate a feedback code based on the compared result; a code register configured to generate a mismatch code, the mismatch code controlling a mismatch between the first termination resistor and the second termination resistor based on the feedback code; and a corrector configured to compensate for the mismatch between the first termination resistor and the second termination resistor based on the mismatch code.

According to example embodiments, a semiconductor device includes a termination resistor circuit including at least two resistors connected between a first voltage and a second voltage with a center node therebetween, the at least two resistors having resistances that change based on a feedback signal; a buffer configured to output a buffer signal based on a voltage at the center node and a reference voltage; a controller configured to, generate the feedback signal based on a potential difference between the voltage at the center node and the reference voltage; the reference voltage being half of the first voltage; generate a feedback code based on the potential difference, convert the feedback code to a mismatch code using a code register, compensate for a mismatch between the at least two resistors based on the mismatch code.

However, example embodiments of the inventive concepts are not restricted to the one set forth herein. The above and other example embodiments of the inventive concepts will become more apparent to one of ordinary skill in the art to which the example embodiments of the inventive concepts pertains by referencing the detailed description of some of the example embodiments of the inventive concepts given below.

BRIEF DESCRIPTION OF DRAWINGS

The above and other features of the example embodiments of the inventive concepts will become more apparent by describing in detail example embodiments thereof with reference to the attached drawings, in which.

DETAILED DESCRIPTION

Figure 1:
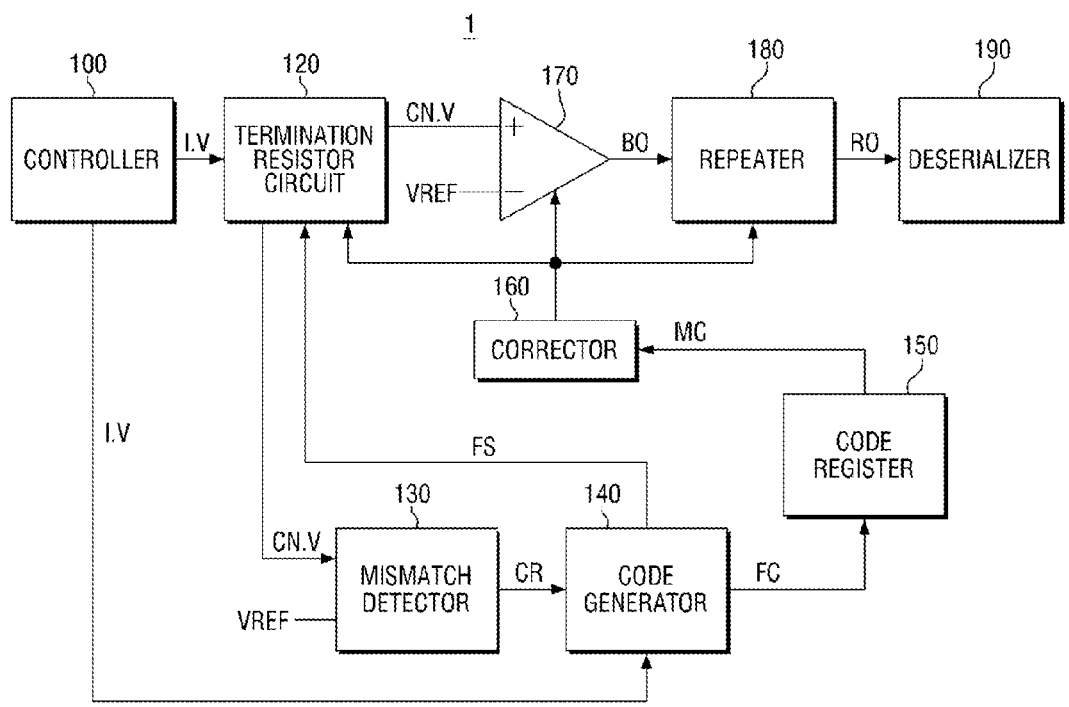
FIG. 1 is a schematic diagram illustrating a semiconductor device according to example embodiments of the inventive concepts.

Example embodiments of the inventive concepts will be described in detail with reference to the accompanying drawings. The example embodiments of the inventive concepts, however, may be embodied in various different forms, and should not be construed as being limited only to the illustrated example embodiments of the inventive concepts. Rather, these example embodiments of the inventive concepts are provided as examples so that this disclosure will be thorough and complete, and will fully convey the concept of the example embodiments of the inventive concepts to those skilled in the art. Accordingly, known processes, elements, and techniques are not described with respect to some of the example embodiments of the inventive concepts. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments of the inventive concepts.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the example embodiments of the inventive concepts. As used herein, the singular forms "a", "an" and "the" are intended to include the plural forms as well, unless the context clearly indicates otherwise, It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which the example embodiments of the inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A semiconductor device according to an example embodiments of the inventive concepts will now be described with reference to FIG. 1, FIG. 2A, and FIG. 2B.

FIG. 1 is a schematic diagram illustrating a semiconductor device according to example embodiments of the inventive concepts. FIGS. 2A and 2B are diagrams illustrating a termination resistor circuit of FIG. 1.

In example embodiments of the inventive concepts, a semiconductor device may be, for example, a dynamic random access memory (DRAM), but is not limited thereto.

Referring to FIG. 1, a semiconductor device 1 according to example embodiments of the inventive concepts may include a controller 100, a termination resistor circuit 120, a mismatch detector 130, a code generator 140, a code register 150, a corrector 160, a buffer 170, a repeater 180, and a deserializer 190.

The controller 100 may include a processor and a memory (not shown).

The memory may be a nonvolatile memory device, for example, a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and so on. Alternatively, the controller 100 may be a microprocessor, a digital signal processor, a microcontroller, an application-specific-integrated-circuit (ASIC), a field programmable gate array (FPGA), or a similar device.

The memory may contain computer readable code, that, when executed by the processor, configures the processor as a special purpose computer configured to provide an initial value I.V to the termination resistor circuit 120 and the code generator 140 such that the code generator 140 may subsequently provide the initial value I.V to the termination resistor circuit 120 through a feedback signal FS to compensate for a mismatch between resistance values of a first termination resistor R1 and a second termination resistor R2. Therefore, eye aperture characteristics of the semiconductor device 1 may improve when the mismatch between the resistance values of the first termination resistor R1 and the second termination resistor R2 may be compensated, The controller 100 may be configured to provide the initial value I.V to the termination resistor circuit 120 and the code generator 140.

Figure 2A:
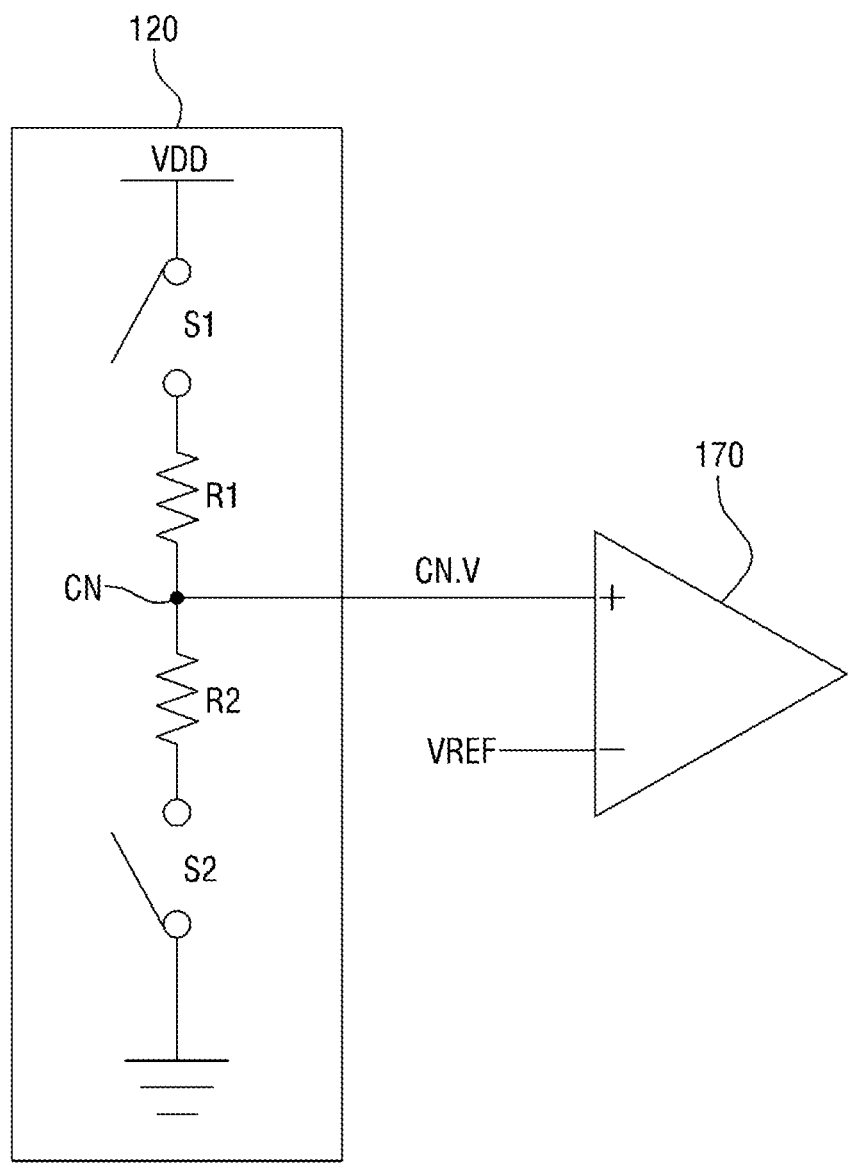
FIGS. 2A and 2B are diagrams illustrating a termination resistor circuit of FIG. 1.

For example, referring to FIG. 2A, the controller 100 may be configured to provide the initial value I.V to the first termination resistor R1 and the second termination resistor R2 within the termination resistor circuit 120, such that the first termination resistor R1 and the second termination resistor R2 may be set to have the initial value I.V.

In addition, the controller 100 may be configured to provide the initial value of the first termination resistor R1 and the second termination resistor R2 as shown in FIG. 2A to the code generator 140, such that the code generator 140 may subsequently provide the initial value I.V to the termination resistor circuit 120 through the feedback signal FS.

The controller 100 may be configured to simultaneously provide the initial value I.V to the termination resistor circuit 120 and the code generator 140, but is not limited thereto. For example, the controller 100 may first provide the initial value I.V to the termination resistor circuit 120, and then provide the initial value IV to the code generator 140.

The termination resistor circuit 120 may receive the initial value I.V from the controller 100.

For example, referring to FIG. 2A, the termination resistor circuit 120 may include the first termination resistor R1, the second termination resistor R2, a first switch S1, and a second switch S2.

The first termination resistor R1 may be connected to a power voltage VDD and the first termination resistor R1 may be between the first switch Si and a center node CN. Further, the first termination resistor R1 may be a pull-up resistor.

The second termination resistor R2 may be connected to a ground and between the second switch S2 and the center node CN. Further, the second termination resistor R2 may be a pull-down resistor.

The first termination resistor R1 and/or the second termination resistor R2 may be a variable resistor.

Figure 2B:
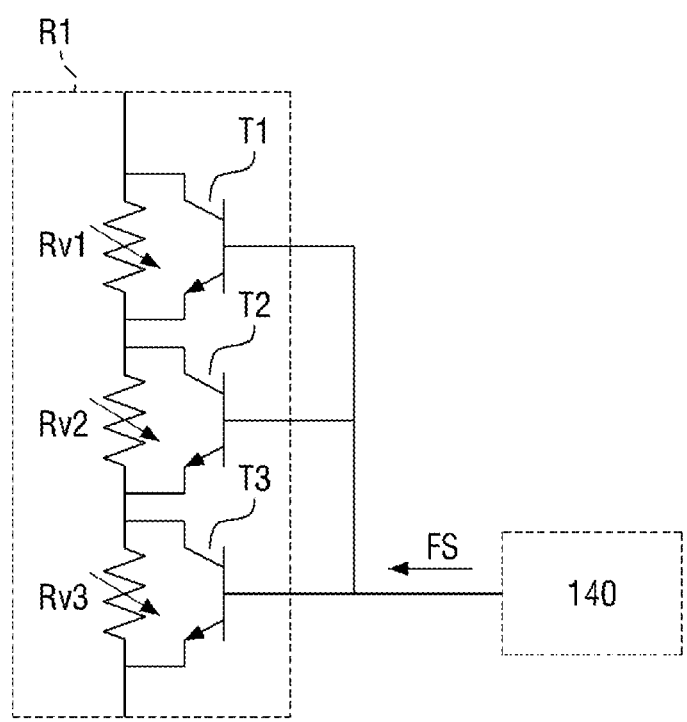

Referring to FIG. 2B, a detailed view of the first termination resistor R1, the variable resistor, is illustrated. Principles of controlling the first termination resistor R1 and the second termination resistor R2 may be identical and thus, a description will be made based on the first termination resistor R1, by way of example.

FIG. 2B illustrates a first termination resistor R1, is controlled by receiving the feedback signal FS from the code generator 140, but the example embodiments of the inventive concepts are not limited thereto. For example, the first termination resistor R1 may be controlled by the corrector 160 to be described later, on the same operational principle as that in FIG. 2B.

The first termination resistor may be a variable resistor circuit in which a plurality of resistors (for example, Rv1, Rv2, and Rv3) may be connected to each other in series and a plurality of transistors (for example, T1, T2, and T3) may be connected to the respective resistors in parallel.

More specifically, the variable resistor R1 may be operated as below.

When all of the transistors T1, T2, and T3 may receive a signal (for example, a feedback signal FS), allowing the transistors T2, and T3 to be turned-off, turn-off resistance levels in the respective transistors may be remarkably increased and a current may flow only in the first to third resistors Rv1, Rv2, and Rv3, such that resistance values measured at both terminals of the first resistor Rv1 and the third resistor Rv3 may be approximately the sum of the first to third resistors (Rv1+Rv2+Rv3).

When only the first transistor T1 among the plurality of the transistors may receive the signal (for example, a feedback signal FS), allowing the first transistor T1 to be turned-on, a resistance value of the first resistor Rv1 connected to the first transistor T1 in parallel may not be measured and only a turn-on resistance value of the first transistor T1 may be measured, such that the resistance values measured at the both terminals of the first resistor Rv1 and the third resistor Rv3 may be approximately the sum of the turn-on resistance value of the first transistor +a second resistance value +a third resistance value (That is, turn-on resistance value of T1+Rv2+Rv3). Alternatively, when only the first transistor T1 and the second transistor T2 among the plurality of the transistors may receive the signal (for example, a feedback signal FS), allowing the first transistor T1 and the second transistor T2 to be turned-on, the first resistor Rv1 and the second resistors Rv2 may not be measured and two turn-on resistance values of the first transistor T1 and the second transistors T2 may be measured, such that the resistance values measured at the both terminals of the first resistor Rv1 and the third resistor Rv3 may be approximately the sum of the turn-on resistance value of the first transistor+the turn-on resistance value of the second transistor+the third resistance value (That is, turn-on resistance value of T1+turn-on resistance value of T2+Rv3). When all of the first to third transistors T1, T2 and T3 (not shown) may receive the signal (for example, a feedback signal FS), allowing the first to third transistors to be turned-on, the resistance values measured at the both terminals of the first resistors Rv1 and the third resistors Rv3 may be the sum of the turn-on resistance value of the first transistor+the turn-on resistance value of the second transistor+the turn-on resistance value of the third transistor (That is, turn-on resistance value of T1+turn-on resistance value of T2+turn-on resistance value of T3).

Referring to FIG. 2A again, the semiconductor device 1 may be the DRAM device as described above and accordingly, when a data may read from the semiconductor device 1, the first switch S1 and the second switch S2 of the termination resistor circuit 120 within the semiconductor device 1 may be turned-off, while a switch of a termination resistor circuit within a memory controller (not shown) controlling the semiconductor device 1, that is, the DRAM, may be turned-on.

Herein, a voltage of the center node CN may be terminated to half of the power voltage VDD due to a voltage distribution of the first termination resistor R1 and the second termination resistor R2.

Conversely, when the data may written to the semiconductor device 1, the first switch S1 and the second switch S2 of the termination resistor circuit 120 within the semiconductor device 1 may be turned-on, while the switch of the termination resistor circuit within the memory controller (not shown) controlling the semiconductor device 1, that is, the DRAM, may be turned-off.

Even here, the voltage of the center node CN may be terminated to the half of the power voltage VDD due to the voltage distribution of the first termination resistor R1 and the second termination resistor R2.

That is, the termination resistor circuit 120 may be a circuit employing a Center Tap Termination (CTT) scheme in which a resistive divided between a termination voltage and ground is used to bias the signal line to a midpoint voltage.

However, due to the mismatch in a process, a level of the first termination resistor R1 and a level of the second termination resistor R2 may not be equal to each other. Thus, it may be desirable to compensate for such a mismatch, and a description regarding the compensation for the mismatch will be followed later on.

Referring to FIG. 1 again, the termination resistor circuit 120 may receive the initial value I.V from the controller 100, may provide a center node voltage CN.V to the mismatch detector 130 and the buffer 170, and may receive the feedback signal FS from the code generator 140.

In addition, the mismatch in the termination resistor circuit 120 may be compensated for by the corrector 160.

The mismatch detector 130 may be implemented in the same manner as the controller 100. For example, the mismatch detector 130 may be a processor, and/or may be the processor associated with the controller 100.

The mismatch detector 130 may be configured to receive the center node voltage CN.V from the termination resistor circuit 120.

For example, referring to FIGS. 1 and 2A, the mismatch detector 130 may be configured to compare a potential difference between the voltage of the center node CN and a reference voltage VREF, where the center node CN may be between the first termination resistor R1 and the second termination resistor R2. That is, the mismatch detector 130 may be configured to compare the potential difference between the center node voltage CN.V and the reference voltage VREF, and provide a compared result CR to the code generator 140.

Here, the reference voltage VREF may be half of the power voltage VDD.

When the center node voltage CN.V is higher than the reference voltage VREF, the mismatch detector 130 may be configured to output a first state (for example, a high level or 1). When the center node voltage CN.V is lower than the reference voltage VREF, the mismatch detector 130 may be configured to output a second state (for example, a low level or 0), but is not limited thereto. For example, the first state may be the low level or 0 and the second state may be the high level or 1.

That is, the compared result CR may include one of the first state (for example, the high level or 1) and the second state (for example, the low level or 0).

Additionally, a time at which the compared result CR changes from the first state to the second state or changes from the second state to the first state may be set to a time at which levels of the first termination resistor R1 and the second termination resistor R2 are equal to each other.

The code generator 140 may be configured to receive the compared result CR and may be configured to generate the feedback signal FS to change values of the first termination resistor R1 and the second termination resistor R2. The code generator 140 may be configured to generate a feedback code FC based on the compared result CR.

Specifically, the code generator 140 may be configured to receive the compared result CR from the mismatch detector 130, and based on the compared result CR, the code generator 140 may be configured to generate the feedback signal FS.

The code generator 140 may be implemented in the same manner as the controller 100. For example, the code generator 140 may be a processor, and/or may be the processor associated with the controller 100.

Further, the code generator 140 may be configured to provide the generated feedback signal FS to the termination resistor circuit 120 and change the value of the first termination resistor R1 and/or the second termination resistor R2.

For example, when the compared result CR includes the first state, the feedback signal FS may decrease the value of the first termination resistor R1 and/or the second termination resistor R2. On the other hand, when the compared result CR includes the second state, the feedback signal FS may increase the value of the first termination resistor R1 and/or the second termination resistor R2.

In addition, when the compared result CR of the mismatch detector 130 changes from the first state to the second state or changes from the second state to the first state (that is, at the time at which levels of the first termination resistor R1 and the second termination resistor R2 are equal to each other), the code generator 140 may be configured to set the values of the first termination resistor R1 and the second termination resistor R2 to the initial value I.V through the feedback signal FS.

Here, the initial value I.V is provided to the code generator 140 from the controller 100 as described above and may be identical to the initial value of the first termination resistor R1 and the second termination resistor R2 initially set in the termination resistor circuit 120.

In addition, before the compared result CR changes from the first state to the second state or changes from the second state to the first state, the code generator 140 may be configured to store information on the initial value 1.V from the controller 100. When the compared result CR changes from the first state to the second state or from the second state to the first state, the code generator 140 may add the information on the initial value I.V to the feedback signal FS and thus, may set the values of the first termination resistor R1 and the second termination resistor R2 to the initial value I.V.

The code generator 140 may be configured to receive the compared result CR from the mismatch detector 130 and may be configured to generate the feedback code PC based on the compared result CR. Further, the code generator 140 may be configured to provide the generated feedback code PC to the code register 150.

Here, when the compared result CR includes the first state, the code generator 140 may decrease a value of the feedback code PC by 1, while when the compared result CR includes the second state, the code generator 140 may be configured to increase the value of the feedback code FC by 1.

That is, the feedback code FC may include information regarding the number of times the value of the first termination resistor R1 or the second termination resistor R2 may be increased and/or decreased. More specifically, the final feedback code FC provided by the code generator 140 to the code register 150 may include information regarding number of up-and down-operations performed to allow the resistance values of the first termination resistor R1 and the second termination resistor R2 to be equal to each other. Accordingly, the final feedback code FC may be in the form of [0:N], where N (N is a natural number) may be the number of up-and down-operations performed on the value of the feedback code FC to allow the resistance values of the first termination resistor R1 and the second termination resistor R2 to be equal to each other.

The code register 150 may be a volatile memory device, for example, a static random access memory (SRAM), a dynamic random access memory (DRAM), etc.

The code register 150 may be configured to generate a mismatch code MC to control a mismatch between the first termination resistor R1 and the second termination resistor R2, based on the feedback code FC.

The mismatch code MC may also be generated on the basis of the feedback code FC and may be in the form of [0:N], where N is a natural number.

For example, the code register 150 may be configured to receive the feedback code FC from the code generator 140 and may be configured to generate the mismatch code MC on the basis of the received feedback code FC to provide the mismatch code MC to the corrector 160.

In addition, the code register 150 may also store the feedback code FC therein.

The corrector 160 may be implemented in the same manner as the controller 100. For example, the corrector 160 may be a processor, and/or may be the processor associated with the controller 100.

The corrector 160 may be configured to compensate for the mismatch between the first termination resistor R1 and the second termination resistor R2, based on the mismatch code MC.

For example, the corrector 160 may be configured to receive the mismatch code MC from the code register 150 and may be configured to control at least one of the termination resistor circuit 120, the butler 170, and the repeater 180 based on the mismatch code MC to compensate for the mismatch (offset) between the first termination resistor R1 and the second termination resistor R2.

That is, the corrector 160 may directly compensate for the mismatch between the first termination resistor R1 and the second termination resistor R2 within the termination resistor circuit 120 based on the mismatch code MC.

For example, the mismatch code MC may include the number of up-and down-operations performed to allow the resistance values of the first termination resistor R1 and the second termination resistor R2 to be equal to each other. The resistance values of the first termination R1 and the second termination resistor R2 varies in response to a change in the feedback code FC may be defined by a user. Thus, on the basis of the mismatch code MC, the corrector 160 may be configured to control the increase value and/or the decrease value of the first termination resistor R1 and/or the second termination resistor R2 within the termination resistor circuit 120 through a control signal (not shown) and may be configured to compensate for the mismatch between the first termination resistor R1 and the second termination resistor R2.

In addition, the corrector 160 may be configured to control the buffer 170 on the basis of the mismatch code MC, and may be configured to compensate for the mismatch between the first termination resistor R1 and the second termination resistor R2. For example, the corrector 160 may be configured to control a common level of the buffer 170 through a control signal (not shown) on the basis of the mismatch code MC, and may compensate for the mismatch between the first termination resistor R1 and the second termination resistor R2.

Finally, the corrector 160 may also be configured to control the repeater 180 on the basis of the mismatch code MC, the corrector 160 may control a duty of the repeater 180 and may be configured to compensate for the mismatch between the first termination resistor R1 and the second termination resistor R2.

Here, the repeater 180 may use, for example, a pulse width modulation (PWM) code. For example, the corrector 160 may be configured to increase and/or decrease a duty of a pulse used in the repeater 180 through a control signal (not shown), and may compensate for the mismatch between the first termination resistor R1 and the second termination resistor R2.

The buffer 170 may be a volatile memory device, for example, a static random access memory (SRAM), a dynamic random access memory (DRAM), etc.

The buffer 170 may be configured to connect to the termination resistor circuit 120, For example, the buffer 170 may be configured to receive the center node voltage CN.V from the termination resistor circuit 120. The center node voltage CN.V may be provided to a positive terminal (+) of the buffer 170, but is not limited thereto.

The buffer 170 may be configured to compare the center node voltage CN.V and the reference voltage VREF and may be configured to generate a buffer output signal Here, the common level of the buffer 170 may be controlled by the corrector 160 and accordingly, the mismatch between the first termination resistor R1 and the second termination resistor R2 may be compensated for and be reflected in the buffer output signal BO.

Further, the buffer 170 may be configured to provide the buffer output signal BO to the repeater 180.

The repeater 180 may be configured to connect to the buffer 170.

For example, the repeater 180 may be configured to receive the buffer output signal BO from the buffer 170 and may generate a repeater output signal RO on the basis of the received buffer output signal BO.

Here, the duty of the repeater 180 may be controlled by the corrector 160 and accordingly, the mismatch between the first termination resistor R1 and the second termination resistor R2 may be compensated for and be reflected in the repeater output signal RO.

Further, the repeater 180 may be configured to provide the repeater output signal RO to the deserializer 190.

The deserializer 190 may be configured to receive the repeater output signal RO from the repeater 180.

For example, the deserializer 190 may be configured to deserialize the repeater output signal RO received from the repeater 180. Here, the term "deserialization" may refer to restoring a byte arrangement to initial form of data and a detailed description thereof will be omitted.

In the semiconductor device 1 according to an example embodiments of the inventive concepts, the center node voltage CN.V of the termination resistor circuit 120 and the reference voltage VREF may be compared with each other to control at least one of the termination resistor circuit 120, the buffer 170, and the repeater 18, whereby the mismatch between the first termination resistor R1 and the second termination resistor R2 may be compensated.

In addition, in the semiconductor device 1, the mismatch between the first termination resistor R1 and the second termination resistor R2 may be compensated, whereby eye aperture characteristics of the semiconductor device 1 itself may be improved.

Additionally, when a plurality of semiconductor devices are simultaneously used, eye apertures of the respective semiconductor devices may overlap with each other. Therefore, eye aperture characteristics of the entire semiconductor device may need to be considered. Thus, the semiconductor device 1 described above may be used as each semiconductor device, whereby eye aperture characteristics of each device may be improved, thereby leading to improvements in the entire eye aperture characteristic (that is, a width of the entire eye aperture narrowed due to a mismatch may be re-increased).

Hereinafter, a semiconductor device according to other example embodiments of the inventive concepts will now be described with reference to FIG. 3 through FIG. 5.

Figure 3:
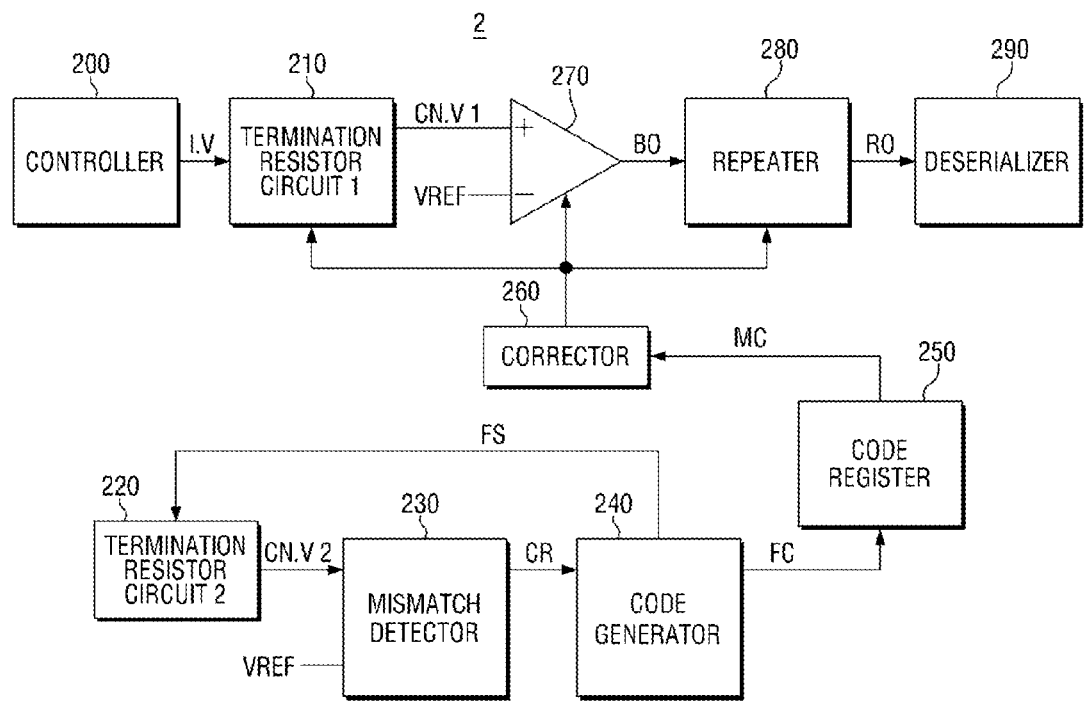
FIG. 3 is a schematic diagram illustrating a semiconductor device according to some example embodiments of the inventive concepts.

FIG. 3 is a schematic diagram illustrating a semiconductor device according to other example embodiment of the inventive concepts. FIG. 4 is a diagram illustrating a first termination resistor circuit of FIG. 3, FIG. 5 is a diagram illustrating a second termination resistor circuit of FIG. 3.

Referring to FIG. 3, a semiconductor device 2 according to example embodiments of the inventive concepts may include a controller 200, a first termination resistor circuit 210, a second termination resistor circuit 220, a mismatch detector 230, a code generator 240, a code register 250, a corrector 260, a buffer 270, a repeater 280, and a deserializer 290.

The controller 200 may include a memory and a processor (not shown).

The memory may be a nonvolatile memory device, for example, a read only memory (ROM), a programmable ROM (PROM), an electrically programmable RUM (EPROM), an electrically erasable and programmable ROM (EEPROM)), a flash memory device, a phase-change RAM (PRAM), a magnetic RAM (MRAM), a resistive RAM (RRAM), a ferroelectric RAM (FRAM), and so on. Alternatively, the controller 200 may be a microprocessor, a digital signal processor, a microcontroller, an application-specific-integrated-circuit (ASIC), a field programmable gate array (FPGA), or a similar device.

The memory may contain computer readable code that, when executed by the processor, configures the processor as a special purpose computer configured to provide an initial value I.V to the first termination resistor circuit 210.

The controller 200 may be configured to provide an initial value I.V to the first termination resistor circuit 210.

Figure 4:
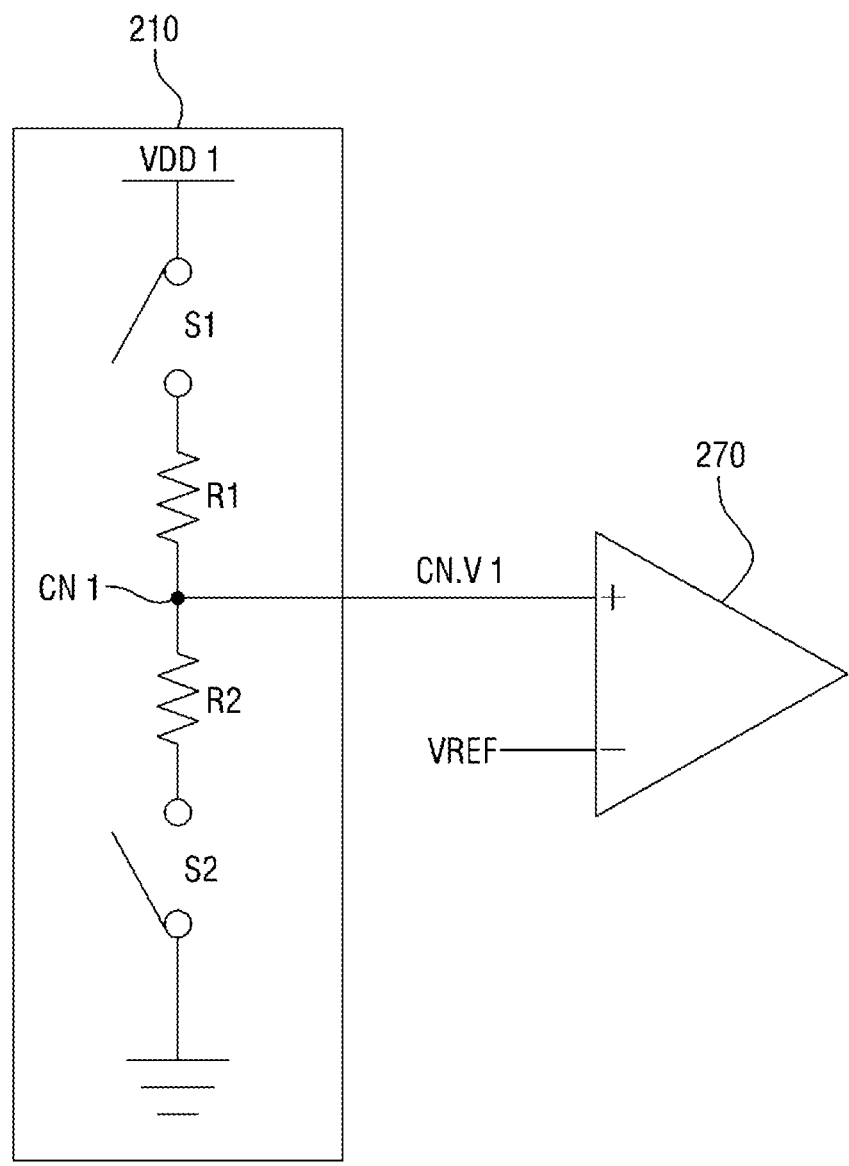
FIG. 4 is a diagram illustrating a first termination resistor circuit of FIG. 3.

For example, referring to FIG. 4, the controller 200 may be configured to provide the initial value I.V to a first termination resistor R1 and a second termination resistor R2 within the first termination resistor circuit 210, such that the first termination resistor R1 and the second termination resistor R2 may be set to have the initial value I.V.

The first termination resistor circuit 210 may be configured to receive the initial value IV from the controller 200.

For example, referring to FIG. 4, the first termination resistor circuit 210 may include the first termination resistor R1, the second termination resistor R2, a first switch S1 and a second switch S2.

The first termination resistor R1 may be connected to a first power voltage VDD1 and may be between the first switch S1 and a first center node CN1. Further, the first termination resistor R1 may be a pull-up resistor.

The second termination resistor R2 may be connected to a ground and may be between the second switch S2 and the first center node CN1. Further, the second termination resistor R2 may be a pull-down resistor.

The semiconductor device 2 may be a DRAM device as described above and accordingly, when a data is read from the semiconductor device 2, the first switch S1 and the second switch S2 of the first termination resistor circuit 210 within the semiconductor device 2 may be turned-off, while a switch of a termination resistor circuit within a memory controller (not shown) controlling the semiconductor device 2, that is, the DRAM, may be turned-on.

Therfore, a voltage of e first center node CN1 may be terminated to half of the first power voltage VDD1 due to a voltage distribution of the first termination resistor R1 and the second termination resistor R2.

Conversely, when the data is written to the semiconductor device 2, the first switch S1 and the second switch S2 of the first termination resistor circuit 210 within the semiconductor device 2 may be turned-on, while a switch of a termination resistor circuit within a memory controller (not shown) controlling the semiconductor device 2, that is, the DRAM, may be turned-off.

Even here, the voltage of the first center node CN1 may be terminated to the half of the first power voltage VDD1 due to the voltage distribution of the first termination resistor R1 and the second termination resistor R2.

That is, the first termination resistor circuit 210 may be a circuit employing a Center Tap Termination (CTT) scheme in which a resistive divided connected between a termination voltage and ground is used to bias the signal line to a midpoint voltage.

However, due to a mismatch in a process, a level of the first termination resistor R1 and a level of the second termination resistor R2 may not be equal to each other. Thus, it may be desirable to compensate for such a mismatch, and a description regarding the compensation for the mismatch will be followed later on.

Referring to FIG. 3 again, the first termination resistor circuit 210 may be configured to receive the initial value I.V from the controller 200 and may provide a first center node voltage CN.V1 to the buffer 270. In addition, the mismatch in the first termination resistor circuit 210 may be compensated for by the corrector 260.

The second termination resistor circuit 220 may be a replica of the first termination resistor circuit 210.

Figure 5:
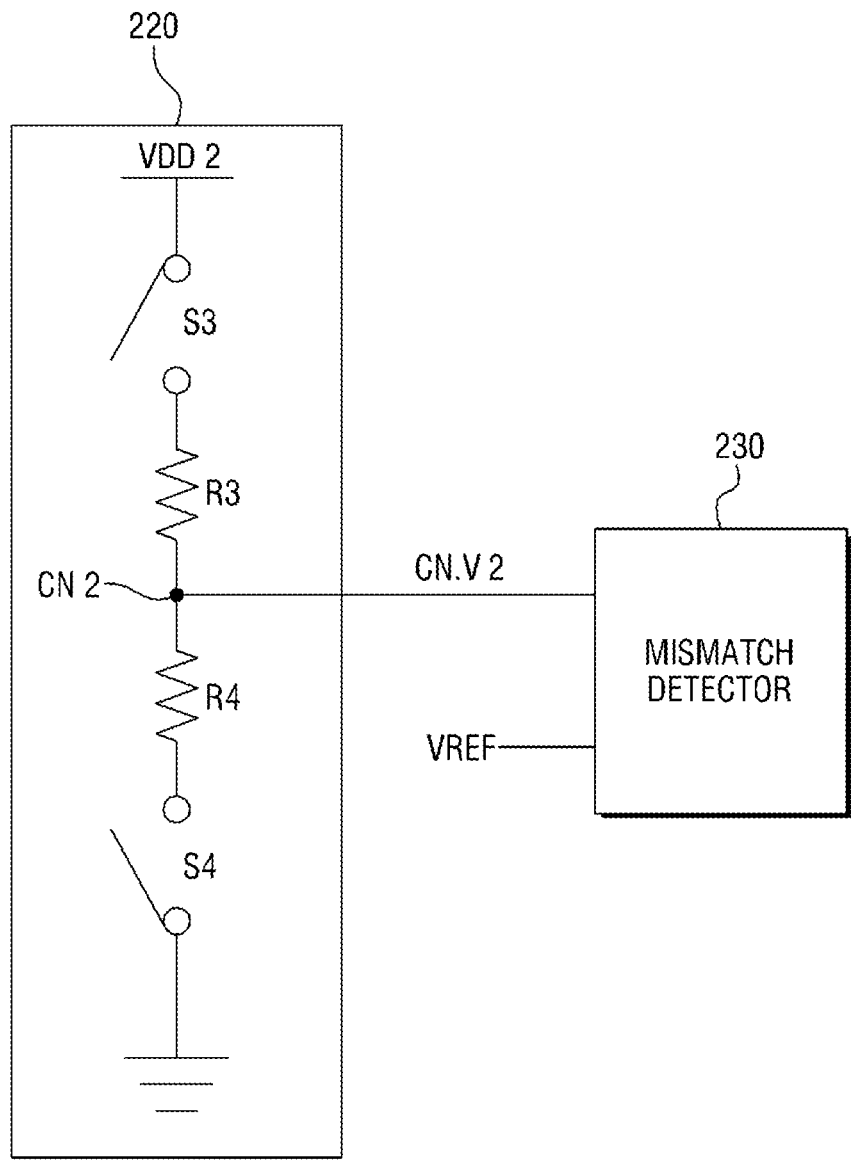
FIG. 5 is a diagram illustrating a second termination resistor circuit of FIG. 3.

For example, referring to FIG. 5, the second termination resistor circuit 220 may include a third termination resistor R3, a fourth termination resistor R4, a third switch S3, and a fourth switch S4.

The third termination resistor R3 may be connected to a second power voltage VDD2 and may be between the third switch S3 and a second center node CN2. Further, the third termination resistor R3 may be a pull-up resistor.

The fourth termination resistor R4 may be connected to a ground and may be between the fourth switch S4 and the second center node CN2. Further, the fourth termination resistor R4 may be a pull-down resistor.

Here, since the second termination resistor circuit 220 may correspond to a replica of the first termination resistor circuit 210, respective components of the second termination resistor circuit 220 may be identical to those of the first termination resistor circuit 210.

Referring to FIG. 3 again, the second termination resistor circuit 220 may be configured to provide a second center node voltage CN.V2 to the mismatch detector 230 and may be configured to receive a feedback signal FS from the code generator 240.

The mismatch detector 230 may be implemented in the same manner as the controller 200. For example, the mismatch detector 230 may be a processor, and/or may be the processor associated with the controller 200.

The mismatch detector 230 may be configured to receive the second center node voltage CN.V2 from the second termination resistor circuit 220.

For example, referring to FIGS. 3 through 5, the mismatch detector 230 may be configured to compare a potential difference between a voltage of the second center node CN2 and a reference voltage VREF, where the second center node CN2 may be between the third termination resistor R3 and the fourth termination resistor R4. That is, the mismatch detector 230 may be configured to compare a potential difference between the second center node voltage CN.V2 and the reference voltage VREF, and provide a compared result CR to the code generator 240.

Here, the reference voltage VREF may be half of the second power voltage VDD2.

When the second center node voltage CN.V2 is higher than the reference voltage VREF, the mismatch detector 230 may output a first state (for example, a high level or 1). When the second center node voltage CN.V2 is lower than the reference voltage VREF, the mismatch detector 230 may output a second state (for example, a low level or 0), but is not limited thereto. For example, the first state may be the low level or 0 and the second state may be the high level or 1.

That is, the compared result CR may include one of the first state (for example, the high level or 1) and the second state (for example, the low level or 0).

Additionally, a time at which the compared result CR changes from the first state to the second state or changes from the second state to the first state may be set to a time at which levels of the third termination resistor R3 and the fourth termination resistor R4 are equal to each other.

The code generator 240 may be configured to receive the compared result CR and may be configured to generate the feedback signal FS to change values of the third termination resistor R3 and the fourth termination resistor R4. The code generator 240 may be configured to generate a feedback code FC based on the compared result CR.

For example, the code generator 240 may be configured to receive the compared result CR from the mismatch detector 230, and based on the compared result CR, may generate the feedback signal FS. Further, the code generator 240 may provide the generated feedback signal FS to the second termination resistor circuit 220 and may change the value of the third termination resistor R3 or the fourth termination resistor R4.

For example, when the compared result CR includes the first state, the feedback signal FS may decrease the value of the third termination resistor R3 or the fourth termination resistor R4. On the other hand, when the compared result CR includes the second state, the feedback signal FS may increase the value of the third termination resistor R3 or the fourth termination resistor R4.

The code generator 240 may be implemented in the same manner as the controller 200. For example, the code generator 240 may be a processor, and/or may be the processor associated with the controller 200.

The code generator 240 may be configured to receive the compared result CR from the mismatch detector 240 and may be configured to generate the feedback code FC based on the compared result CR. Further, the code generator 240 may be configured to provide the generated feedback code FC to the code register 250.

Here, when the compared result CR includes the first state, the code generator 240 may be configured to decrease a value of the feedback code FC by 1, while when the compared result CR includes the second state, the code generator 240 may increase the value of the feedback code FC by 1.

That is, the feedback code FC may include information regarding the number of times the value of the third termination resistor R3 or the fourth termination resistor R4 is increased and/or decreased.

For example, the final feedback code FC provided by the code generator 240 to the code register 250 may include information regarding the number of up-and down-operations performed to allow the resistance values of the third termination resistor R3 or the fourth termination resistor R4 to be equal to each other.

The code register 250 may be a volatile memory device, for example, a static random access memory (SRAM), a dynamic random access memory (DRAM), etc.

The code register 250 may be configured to generate a mismatch code MC to control the mismatch between the first termination resistor R1 and the second termination resistor R2, based on the feedback code FC.

For example, the code register 250 may be configured to receive the feedback code FC from the code generator 240 and may be configured to generate the mismatch code MC on the basis of the received feedback code FC to provide the mismatch code MC to the corrector 260.

The feedback code FC may include information regarding the number of up-and down-operations performed to allow the resistance values of the third termination resistor R3 or the fourth termination resistor R4 to be equal to each other. Further, since the third termination resistor R3 and the fourth termination resistor R4 correspond to the first termination resistor R1 and the second termination resistor R2, respectively, the mismatch code MC may control the mismatch between the first termination resistor R1 and the second termination resistor R2.

In addition, the code register 250 may also be configured to store the feedback code FC therein.

The corrector 260 may be implemented in the same manner as the controller 200. For example, the corrector 260 may be a processor, and/or may be the processor associated with the controller 200.

The corrector 260 may be configured to compensate for the mismatch between the first termination resistor R1 and the second termination resistor R2, based on the mismatch code MC.

For example, the corrector 260 may be configured to receive the mismatch code MC from the code register 250 and may be configured to control at least one of the first termination resistor circuit 210, the buffer 270, and the repeater 280 based on the mismatch code MC to thereby compensate for the mismatch (offset) between the first termination resistor R1 and the second termination resistor R2

That is, when the corrector 260 controls the first termination resistor circuit 210 on the basis of the mismatch code MC, the corrector 260 may directly compensate for the mismatch between the first termination resistor R1 and the second termination resistor R2 within the first termination resistor circuit 210, In addition, when the corrector 260 controls the buffer 270 on the basis of the mismatch code MC, the corrector 260 may control a common level of the buffer 270 and may compensate for the mismatch between the first termination resistor R1 and the second termination resistor R2.

Finally, when the corrector 260 controls the repeater 280 on the basis of the mismatch code MC, the corrector 260 may control a duty of the repeater 280 and may compensate for the mismatch between the first termination resistor R1 and the second termination resistor The buffer 270 may be a volatile memory device, for example, a statics random access memory (SRAM), a dynamic random access memory (DRAM), etc.

The buffer 270 may be connected to the first termination resistor circuit 210.

For example, the buffer 270 may be configured to receive the first center node voltage CN.V1 from the first termination resistor circuit 210. The first center node voltage CN.V1 may be provided to a positive terminal (+) of the buffer 270, but is not limited thereto.

The buffer 270 may be configured to compare the first center node voltage CN.V1 received from the first termination resistor circuit 210 and the reference voltage VREF and may generate a buffer output signal BO. Here, the common level of the buffer 270 may be controlled by the corrector 260 and accordingly, the mismatch between the first termination resistor R1 and the second termination resistor R2 may be compensated for and be reflected in the buffer output signal BO.

Further, the buffer 270 may be configured to provide the buffer output signal BO to the repeater 280.

The repeater 280 may be configured to connect to the buffer 270.

For example, the repeater 280 may be configured to receive the buffer output signal BO from the buffer 270 and may be configured to generate a repeater output signal RO on the basis of the received buffer output signal 130.

Here, a duty of the repeater 280 may be controlled by the corrector 260 and accordingly, the mismatch between the first termination resistor R1 and the second termination resistor R2 may be compensated for and be reflected in the repeater output signal RO.

Further, the repeater 280 may be configured to provide the repeater output signal R0 to the deserializer 290.

The deserializer 290 may be configured to receive the repeater output signal RO from the repeater 280.

For example, the deserializer 290 may be configured to deserialize the repeater output signal RO received from the repeater 280. Here, the term "deserialization" may refer to restoring a byte arrangement to initial form of data and a detailed description thereof will be omitted.

The semiconductor device 2 according to other example embodiments of the inventive concepts may include the second termination resistor circuit 220 which is a replica of the first termination resistor circuit 210, unlike the semiconductor device 1.

Accordingly, the semiconductor device 2 may determine a degree of mismatch between the third and fourth termination resistors R3 and R4, replicas of the first termination resistor R1 and the second termination resistor R2 through the second termination resistor circuit 220 and may generate the mismatch code MC on the basis of the mismatch between the third and fourth termination resistors R3 and R4 to compensate for the mismatch between the first and second termination resistors R1 and R2.

Figure 6:
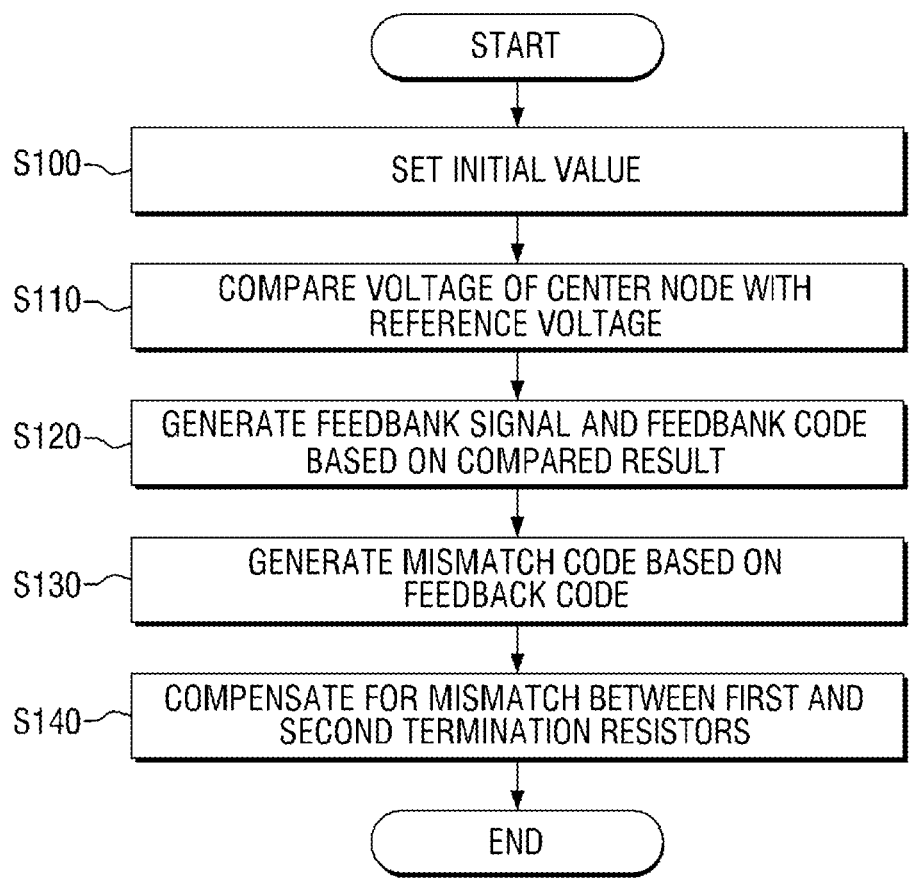
FIGS. 6 and 7 are diagrams illustrating an operating method of the semiconductor device of FIG. 1.
Figure 7:
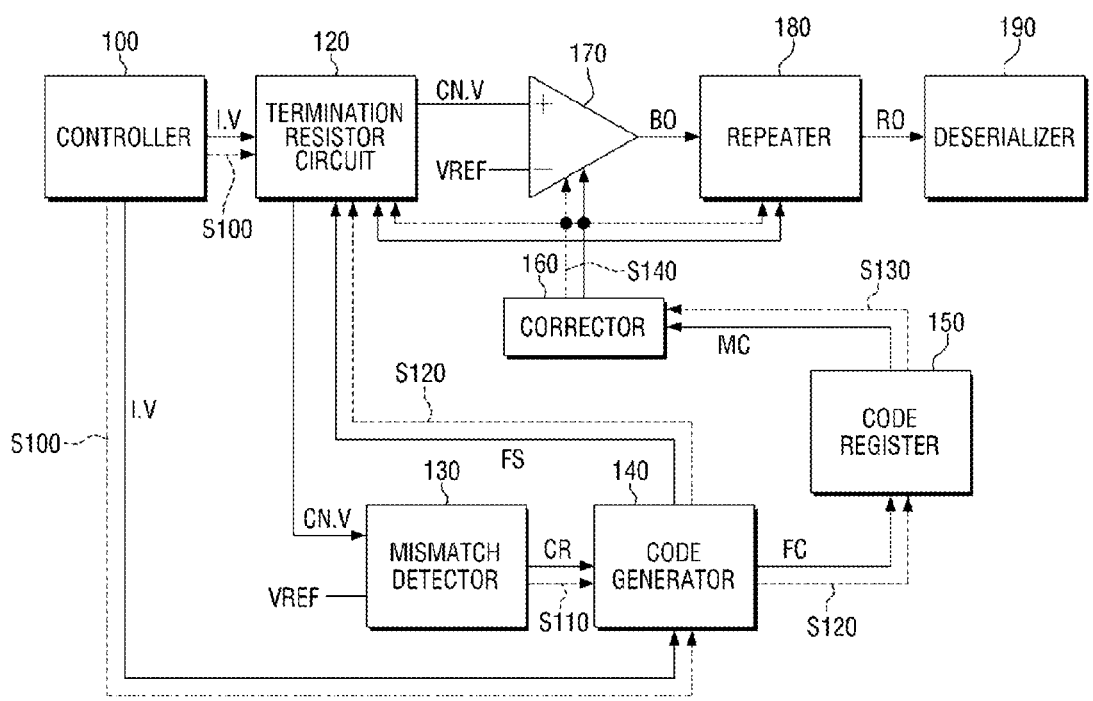

Hereinafter, an operating method of the semiconductor device of FIG. 1 will be described with reference to FIGS. 6 and 7, FIGS. 6 and 7 are diagrams illustrating an operating method of the semiconductor device of FIG. 1.

Referring to FIG. 2A and FIGS. 6 and 7, in operation S100, the controller 100 may set an initial value I.V of the first termination resistor R1 and the second termination resistor R2 in the termination resistor circuit 120..

For example, the controller 100 may be configured to provide the initial value I.V to the termination resistor circuit 120. That is, the controller 100 may be configured to provide the initial value I.V to the first termination resistor R1 and the second termination resistor R2 within the termination resistor circuit 120, such that the first termination resistor R1 and the second termination resistors R2 may be set to have the initial value I.V.

In addition, the controller 100 may be configured to provide the initial value of the first termination resistor R1 and the second termination resistor R2 to the code generator 140, such that the code generator 140 may be configured to subsequently provide the initial value I.V to the termination resistor circuit 120 through the feedback signal FS, In operation S110, the mismatch detector 130 may compare the voltage of the center node CN and the reference voltage VREF with each other.

Specifically, the mismatch detector 130 may compare the potential difference between the voltage of the center node CN and the reference voltage VREF, the center node CN may be between the first termination resistors R1 and the second termination resistor R2. The mismatch detector 130 may provide the compared result CR to the code generator 140.

Here, the reference voltage VREF may be half of the power voltage VDD.

When the center node voltage CNN is higher than the reference voltage VREF, the mismatch detector 130 may output the first state (for example, a high level or 1). When the center node voltage CN.V is lower than the reference voltage VREF, the mismatch detector 130 may output the second state (for example, a low level or 0).

That is, the compared result CR may include one of the first state (for example, the high level or 1) and the second state (for example, the low level or 0).

Additionally, a time at which the compared result CR changes from the first state to the second state and/or changes from the second state to the first state may be set to a time at which levels of the first termination resistor R1 and the second termination resistor R2 are equal to each other.

In operation S120, the code generator 140 may generate the feedback signal FS and the feedback code FC on the basis of the compared result CR outputted from the mismatch detector 130.

Specifically, the code generator 140 may be configured to receive the compared result CR from the mismatch detector 130, and, based on the compared result CR, may be configured to generate the feedback signal FS. Further, the code generator 140 may be configured to provide the generated feedback signal FS to the termination resistor circuit 120 and may change the value of the first termination resistor R1 or the second termination resistor R2.

In addition, when the compared result CR of the mismatch detector 130changes from the first state to the second state and/or changes from the second state to the first state (that is, at the time at which levels of the first termination resistor R1 and the second termination resistor R2 may be equal to each other), the code generator 140 may be configured to generate the feedback signal FS based on the information regarding the initial value I.V received from the controller 100 and may be configured to provide the generated feedback signal FS to the termination resistor circuit 120 to set the values of the first termination resistor R1 and the second termination resistor R2 to the initial value I.V.

Moreover, the code generator 140 may be configured to receive the compared result CR from the mismatch detector 130 and may be configured to generate the feedback code FC based on the compared result CR. Further, the code generator 140 may be configured to provide the generated feedback code FC to the code register 150.

In operation S130, the code generator 150 may generate the mismatch code based on the feedback code FC.

Specifically, the code register 150 may be configured to receive the feedback code FC from the code generator 140 and may be configured to generate the mismatch code MC on the basis of the received feedback code FC to provide the mismatch code MC to the corrector 160.

In operation S140, the corrector 160 may compensate for the mismatch between the first termination resistor R1 and the second termination resistor R2.

Specifically, the corrector 160 may be configured to receive the mismatch code MC from the code register 150 and may be configured to control at least one of the termination resistor circuit 120, the buffer 170, and the repeater 180 based on the mismatch code MC to compensate for the mismatch (offset) between the first termination resistor R1 and the second termination resistor R2.

Hereinafter, an operating method of the semiconductor device of FIG. 3 will be described with reference to FIGS. 8 and 9.

Figure 8:
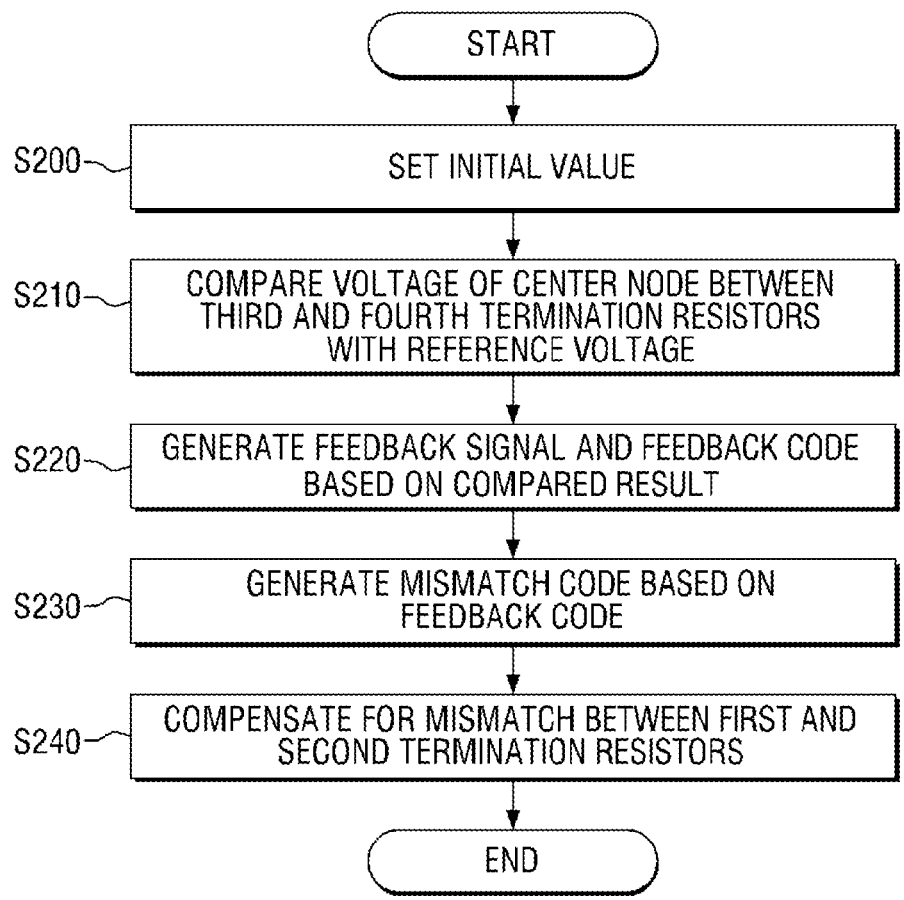
FIGS. 8 and 9 are diagrams illustrating an operating method of the semiconductor device of FIG. 3.
Figure 9:
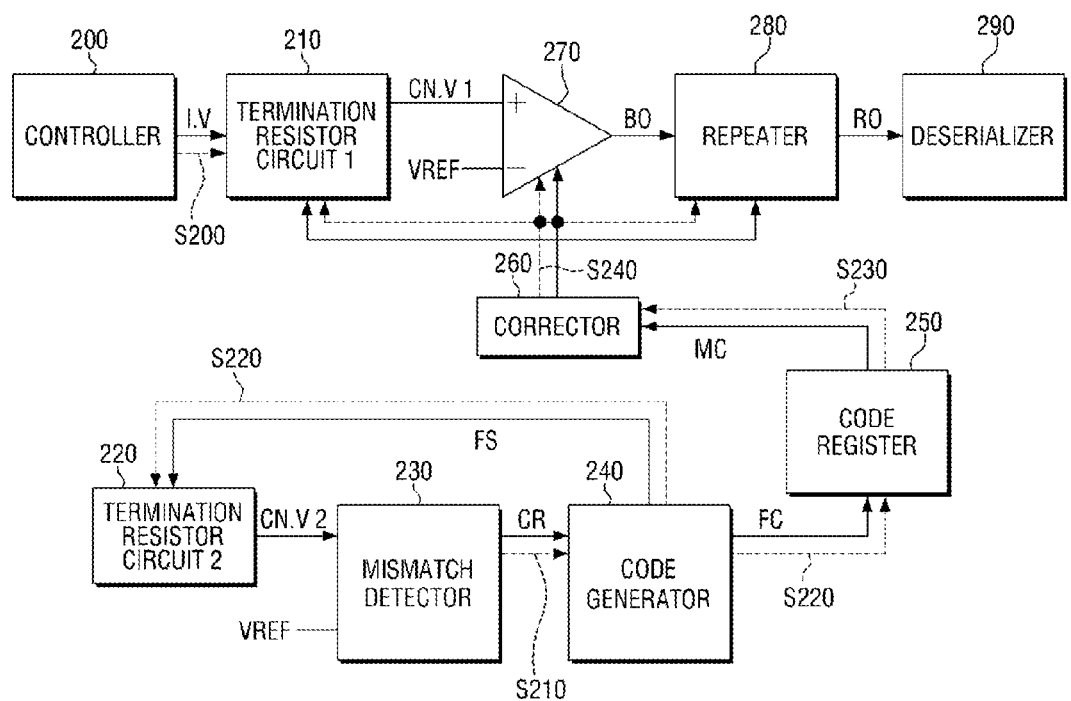

FIGS. 8 and 9 are diagrams illustrating an operating method of the semiconductor device of FIG. 3.

Referring to FIGS. 4, 5, 8 and 9, in operation S200, the controller 200 may set an initial value I.V of the first termination resistor R1 and the second termination resistor R2 in the first termination resistor 210.

Specifically, the controller 200 may be configured to provide the initial value I.V to the first termination resistor circuit 210. That is, the controller 200 may be configured to provide the initial value I.V to the first termination resistor R1 and the second termination resistor R2 within the first termination resistor circuit 210, such that the first termination resistor R1 and the second termination resistors R2 may be set to have the initial value I.V.

In operation S210, the mismatch detector 230 may compare the voltage of the second center node CN2 and the reference voltage VREF, the second center node CN2 may be between the third termination resistor R3 and the fourth termination resistor R4 and the reference voltage.

Specifically, the mismatch detector 230 may be configured to compare the potential difference between the voltage of the second center node CN2 and the reference voltage VREF, the second center node CN2 may be between the third termination resistor R3 and the fourth termination resistor R4 within the second termination resistor circuit 220. That is, the mismatch detector 230 may be configured to compare the potential difference between the second center node voltage CN.V2 and the reference voltage VREF and provide the compared result CR to the code generator 240.

Here, since the second termination resistor circuit 220 may be a replica of the first termination resistor circuit 210 which has been described as above, a detailed description will be omitted.

In operation S220, the code generator 240 may generate the feedback signal FS and the feedback code FC on the basis of the compared result.

Specifically, the code generator 240 may be configured to receive the compared result CR from the mismatch detector 230 and based on the compared result CR, the code generator 240 may be configured to generate the feedback signal FS. Further, the code generator 240 may be configured to provide the generated feedback signal FS to the second termination resistor circuit 220 and change the value of the third termination resistor R3 or the fourth termination resistor R4.

Moreover, the code generator 240 may be configured to receive the compared result CR from the mismatch detector 240 and may be configured to generate the feedback code FC based on the compared result CR. Further, the code generator 240 may be configured to provide the generated feedback code FC to the code register 250.

Here, when the compared result CR of the mismatch detector 230 changes from the first state to the second state or changes from the second state to the first state (that is, at the time at which levels of the third termination resistor R3 and the fourth termination resistor R4 may be equal to each other), the code generator 240 may be configured to generate the feedback code PC and may be configured to store the feedback code in the code register 250.

In operation S230, the code register 250 may generate the mismatch code MC based on the feedback code FC.

Specifically, the code register 250 may be configured to receive the feedback code FC from the code generator 240 and may be configured to generate the mismatch code MC on the basis of the received feedback code FC to provide the mismatch code MC to the corrector 260.

In operation S240, the corrector 260 may compensate for the mismatch between the first termination resistor R1 and the second termination resistor R2.

Specifically, the corrector 260 may be configured to receive the mismatch code MC from the code register 250 and may be configured to control at least one of the first termination resistor circuit 210, the buffer 270, and the repeater 280 based on the mismatch code MC to thereby compensate for the mismatch (offset) between the first termination resistor R1 and the second termination resistor R2.

Figure 10:
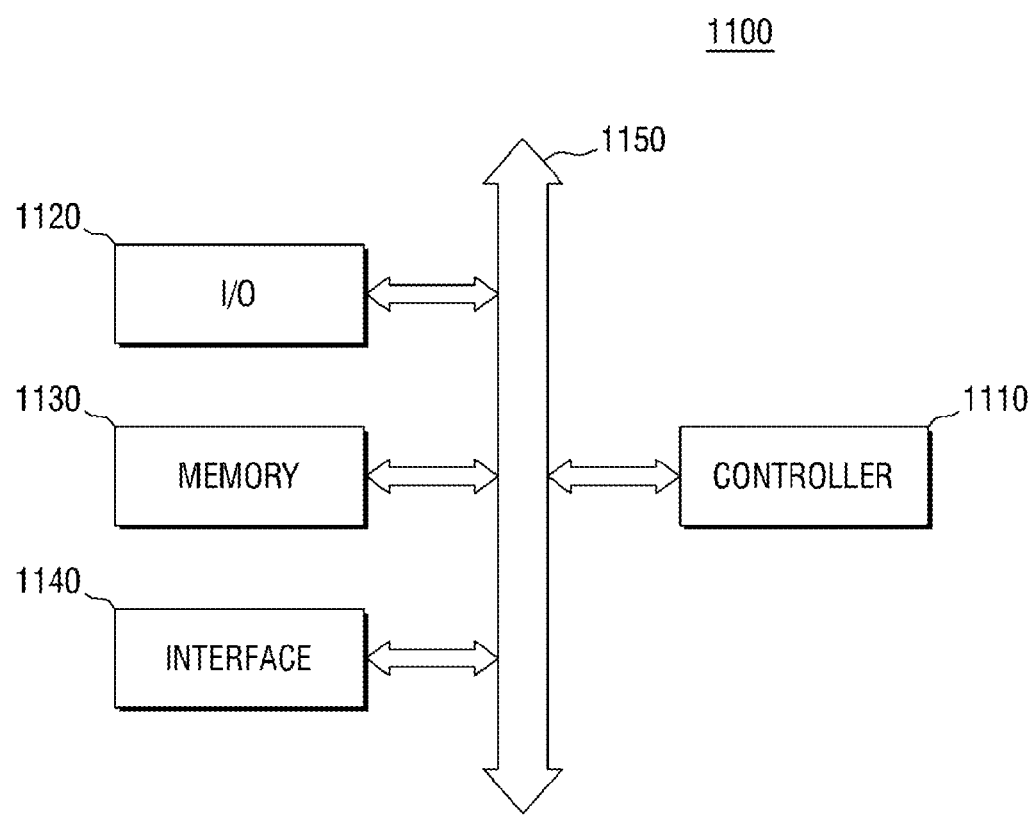
FIG. 10 is a block diagram of an electronic system including semiconductor devices according to some example embodiments of the inventive concepts.

FIG. 10 is a block diagram of an electronic system including semiconductor devices according to some example embodiments of the inventive concepts.

Referring to FIG. 10, an electronic system 1100 according to example embodiments of the inventive concepts may include a controller 1110, an input/output device (I/O) 1120, a memory device 1130, an interface 1140 and a bus 1150. The controller 1110, the input/output device (I/O) 1120, the memory device 1130, and/or the interface 1140 may be coupled to each other through the bus 1150. The bust 1150 may correspond to a path through which data may be transferred.

The controller 1110 may include at least one of a microprocessor, a digital signal processor, a microcontroller and logic devices capable of performing similar functions thereto. The input/output device (I/O) 1120 may include a keypad, a keyboard, a display and the like. The memory device 1130 may store data and/or a command or the like therein. The interface 1140 may transmit data to communication networks and receive data from the communication networks. The interface 1140 may have a wired and/or wireless form. For example, the interface 1140 may include an antenna, a wired/wireless transceiver and the like. Although not illustrated, the electronic system 1100 may be an operating memory to improve operations of the controller 1110 and may further include a high speed dynamic random access memory and/or static random access memory or the like. The semiconductor devices 1 and 2 according to some example embodiments of the inventive concepts may be within the memory device 1130 or may be as parts of the controller 1110, the input/output device (I/O) 1120 and the like.

The electronic system 1100 may be applied to personal digital assistants (PDA), portable computers, web tablets, wireless phones, mobile phones, digital music players, memory cards, and/or all electrical products capable of transmitting and receiving information in wireless environments.

Figure 11:
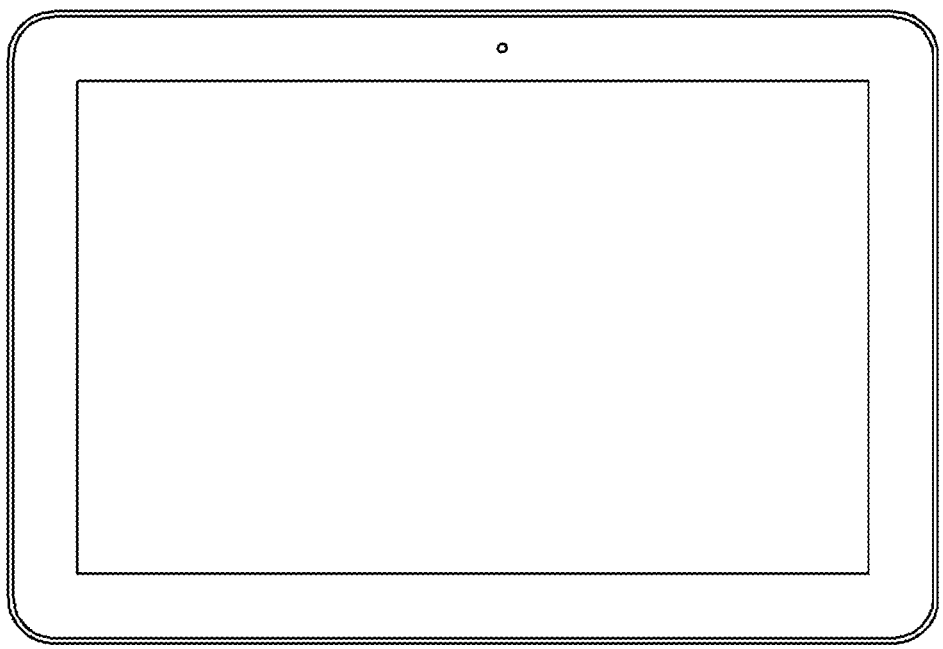
FIGS. 11 through 13 are views illustrating electronic systems to which semiconductor devices according to some example embodiments of the inventive concepts may be applied.
Figure 12:
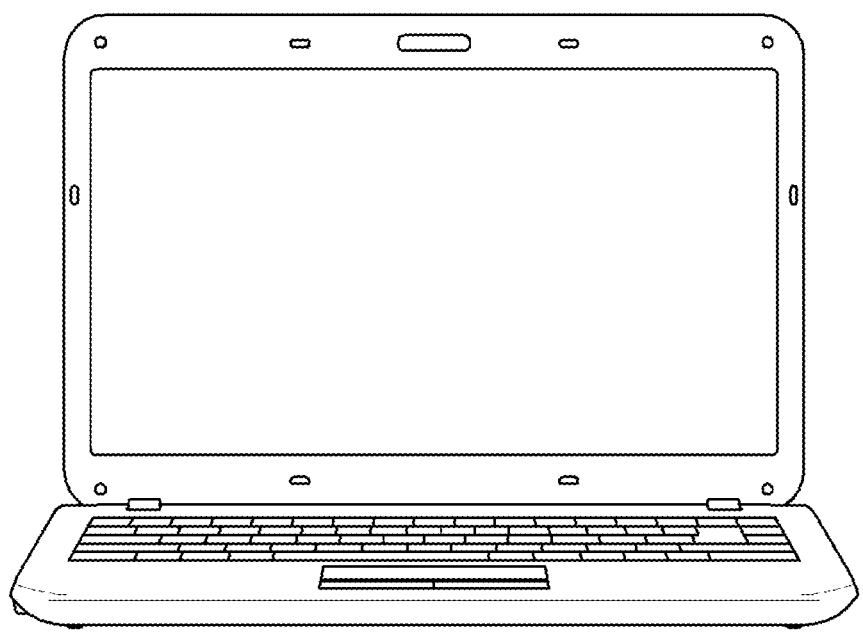
Figure 13:
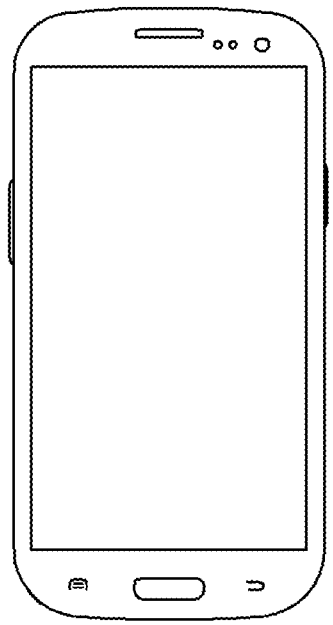

FIGS. 11 through 13 are views illustrating example of electronic systems to which the semiconductor devices according to some example embodiments of the inventive concepts may be applied.

FIG. 11 is a view illustrating a tablet PC 1200, FIG. 12 is a view illustrating a laptop computer 1300, and FIG. 13 is a view illustrating a smartphone 1400. The semiconductor devices 1 and 2 according to some example embodiments of the inventive concepts may be used in the tablet PC 1200, the laptop computer 1300, the smartphone 1400 and the like.

In addition, it may be apparent to a person having ordinary skill in the art that the semiconductor devices 1 and 2 according to some example embodiments of the inventive concepts may be applied to other integrated circuit devices (not shown). That is, in the above description, only the tablet PC 1200, the laptop computer 1300, and the smartphone 1400 are illustrated as the electronic systems according to the embodiment. However, examples of the electronic systems according to the example embodiments are not limited thereto. In some example embodiments of the inventive concepts, the electronic systems may be implemented as computers, UMPC (Ultra Mobile PC), workstations, netbook computers, personal digital assistants (PDA), portable computers, wireless phones, mobile phones, e-books, portable multimedia player (PMP), portable game consoles, navigation devices, black boxes, digital cameras, 3-dimensional televisions, digital audio recorders, digital audio players, digital picture recorders, digital picture players, digital video recorders, digital video players and the like.

While example embodiments have been shown and described above, it will be apparent to those skilled in the art that modifications and variations could be made without departing from the spirit and scope of the example embodiments of the inventive concepts as defined by the appended claims.

What is claimed is:

1. A semiconductor device comprising:
    a termination resistor circuit including a first termination resistor connected to a power voltage and a second termination resistor between the first termination resistor and a ground, the first termination resistor and the second termination resistor having values that change based on a feedback signal;
    a mismatch detector configured to generate a compared result based on a potential difference between a voltage of a center node and a reference voltage, the center node being between the first termination resistor and the second termination resistor, a value of the reference voltage being half of the power voltage;
    a code generator configured to,
        generate the feedback signal based on the compared result, and
        generate a feedback code based on the compared result;
    a code register configured to generate a mismatch code, the mismatch code controlling a mismatch between the first termination resistor and the second termination resistor based on the feedback code; and
    a corrector configured to compensate for the mismatch between the first termination resistor and the second termination resistor based on the mismatch code, wherein,
        the termination resistor circuit is configured to set values of the first termination resistor and the second termination resistor to an initial value based on the feedback signal when the compared result changes from a first state to a second state, the second state being different from the first state.
2. The semiconductor device of claim 1, wherein the first termination resistor is a pull-up resistor and the second termination resistor is a pull-down resistor.

3. The semiconductor device of claim 1, wherein the mismatch detector is configured to output the first state when the voltage of the center node is higher than the reference voltage, and to output the second state when the voltage of the center node is lower than the reference voltage.

4. The semiconductor device of claim 3, wherein the compared result includes one of the first state and the second state.

5. The semiconductor device of claim 4, wherein when the compared result includes the first state, the code generator is configured to adjust the feedback signal provided to the termination resistor circuit, and the termination resistor circuit is configured to decrease a value of at least one of the first termination resistor and the second termination resistor based on the adjusted feedback signal.

6. The semiconductor device of claim 4, wherein when the compared result includes the second state, the code generator is configured to adjust the feedback signal provided to the termination resistor circuit, and the termination resistor circuit is configured to increase a value of at least one of the first termination resistor and the second termination resistor based on the adjusted feedback signal.

7. The semiconductor device of claim 1, wherein the code generator transmits the feedback signal to the termination resistor circuit.

8. The semiconductor device of claim 1, further comprising a controller configured to,
set the initial value of the first termination resistor and the second termination resistor, transmit the initial value of the first termination resistor and the second termination resistor to the code generator.

9. The semiconductor device of claim 8, wherein the code generator is configured to,
transmit the feedback signal to the termination resistor circuit, and
insert information regarding the initial value into the feedback signal when the compared result of the mismatch detector is changed from the first state to the second state.

10. The semiconductor device of claim 1, wherein the feedback code includes information regarding the number of times by which a value of at least one of the first termination resistor and the second termination resistor changes.

11. The semiconductor device of claim 1, further comprising:
a buffer connected to the termination resistor circuit, and
a repeater connected to the buffer.

12. The semiconductor device of claim 11, wherein the corrector is configured to,
control a common level of the buffer, and
compensate for the mismatch between the first termination resistor and the second termination resistor based on the mismatch code.

13. The semiconductor device of claim 11, wherein the corrector is configured to,
control a duty of the repeater, and
compensate for the mismatch between the first termination resistor and the second termination resistor based on the mismatch code.

14. The semiconductor device of claim 11, wherein the corrector is configured to,
control at least one of the termination resistor circuit, the buffer, and the repeater, and
compensate for the mismatch between the first termination resistor and the second termination resistor based on the mismatch code.

15. A semiconductor device comprising:
a termination resistor circuit including a first termination resistor connected to a power voltage and a second termination resistor between the first termination resistor and a ground, the first termination resistor and the second termination resistor having values that change based on a feedback signal;
a mismatch detector configured to generate a compared result based on a potential difference between a voltage of a center node and a reference voltage, the center node being between the first termination resistor and the second termination resistor, a value of the reference voltage being half of the power voltage;
a code generator configured to,
generate the feedback signal based on the compared result, and
generate a feedback code based on the compared result;
a code register configured to generate a mismatch code, the mismatch code controlling a mismatch between the first termination resistor and the second termination resistor based on the feedback code;
a corrector configured to compensate for the mismatch between the first termination resistor and the second termination resistor based on the mismatch code;
a controller configured to,
set an initial value of the first termination resistor and the second termination resistor, and
provide the initial value of the first termination resistor and the second termination resistor to the code generator;
a buffer configured to connect to the termination resistor circuit; and
a repeater configured to connect to the buffer, wherein,
the termination resistor circuit is configured to set the values of the first termination resistor and the second termination resistor to the initial value based on the feedback signal when the compared result of the mismatch detector changes from a first state to a second state different, the second state being different from the first state, and
the corrector is configured to,
control at least one of the termination resistor circuit, the buffer, and the repeater, and
compensate for the mismatch between the first termination resistor and the second termination resistor based on the mismatch code.

16. A semiconductor device comprising:
a termination resistor circuit including at least two resistors connected between a first voltage and a second voltage with a center node therebetween, the at least two resistors having resistances that vary based on a feedback signal;
a buffer configured to output a buffer signal based on a voltage at the center node and a reference voltage;
a controller configured to,
generate the feedback signal based on the voltage at the center node and the reference voltage, the reference voltage being half of the first voltage,
generate a feedback code based on the voltage at the center node and the reference voltage,
convert the feedback code to a mismatch code using a code register; and
compensate for a mismatch between the at least two resistors based on the mismatch code.

17. The semiconductor device of claim 16, wherein the controller is configured to compensate for the mismatch by varying a common level of the buffer based on the mismatch code.

18. The semiconductor device of claim 16, wherein the controller is configured to compensate for the mismatch by adjusting output values of at least one of the termination resistor circuit and the buffer.

19. The semiconductor device of claim 16, wherein the controller is configured to set an initial value of the at least two resistors of the termination circuit.

20. The semiconductor device of claim 16, wherein the controller is configured to generate the feedback code based on a potential difference between the voltage at the center node and the reference voltage.

* * * * *